US009518852B2

(12) United States Patent
McGuire et al.

(10) Patent No.: US 9,518,852 B2
(45) Date of Patent: Dec. 13, 2016

(54) HYBRID POWER MODULE WITH FAULT DETECTION (71) Applicant: Rosemount Inc., Chanhassen, MN (US)

(72) Inventors: Chad Michael McGuire, Shakopee, MN (US); Kelly Michael Orth, Apple Valley, MN (US); Theodore Henry Schnaare, Carver, MN (US)

(73) Assignee: Rosemount Inc., Chanhassen, MN (US)

( * ) Notice: Subject to any disclaimer, the term of this patent is extended or adjusted under 35 U.S.C. 154(b) by 942 days.

(21) Appl. No.: 13/628,543

(22) Filed: Sep. 27, 2012

(65) Prior Publication Data

US 2014/0088893 A1 Mar. 27, 2014

(51) Int. Cl.
*G01R 31/36* (2006.01)
*H02J 7/34* (2006.01)
*G01D 21/00* (2006.01)
*G01R 31/40* (2014.01)
*G01R 31/28* (2006.01)

(52) U.S. Cl.
CPC ............. *G01D 21/00* (2013.01); *H02J 7/34* (2013.01); *G01R 31/2829* (2013.01); *G01R 31/36* (2013.01); *G01R 31/40* (2013.01)

(58) Field of Classification Search
CPC ..... H04B 7/0814; H04W 4/00; H02J 13/0079; H02J 4/00; G01R 1/00; G05B 2219/25428; G05B 2219/33192; G05B 19/0423
USPC . 340/657, 679, 870.07; 455/277.1; 702/116, 64, 58
See application file for complete search history.

(56) References Cited

U.S. PATENT DOCUMENTS

| 5,272,382 | A | | 12/1993 | Heald et al. |
| 5,440,590 | A | | 8/1995 | Birchler et al. |
| 5,481,571 | A | | 1/1996 | Balachandran et al. |
| 5,561,673 | A | | 10/1996 | Takai et al. |
| 5,952,963 | A | | 9/1999 | Shen et al. |
| 6,002,563 | A | * | 12/1999 | Esakoff et al. ................. 361/87 |
| 6,067,449 | A | | 5/2000 | Jager |
| 6,114,955 | A | | 9/2000 | Brunius et al. |
| 6,167,258 | A | | 12/2000 | Schmidt et al. |
| 6,201,472 | B1 | | 3/2001 | Linford et al. |

(Continued)

FOREIGN PATENT DOCUMENTS

| EP | 0 712 550 B1 | 9/2001 |
| EP | 1 099 316 B1 | 4/2003 |

(Continued)

OTHER PUBLICATIONS

International Search Report and Written Opinion from PCT Appln. Serial No. PCT/US2014/038203; dated Nov. 13, 2014, 14 pages.

*Primary Examiner* — John Breene
*Assistant Examiner* — Jeffrey Aiello
(74) *Attorney, Agent, or Firm* — Kinney & Lange, P.A.

(57) ABSTRACT

A wireless field device assembly comprises a process sensor, a housing, a power module, and a processor. The process sensor is configured to monitor a process variable and produce a sensor signal. The housing encloses an interior space of the wireless field device. The power module comprises an energy storage device and a connection to a local power source, and is configured to be housed in the wireless field device. The processor is located within the interior space, and is powered by the power module. The processor produces a fault signal value used to differentiate between energy storage device faults, local power source faults, and no-fault states.

33 Claims, 8 Drawing Sheets (56) References Cited

U.S. PATENT DOCUMENTS

| | | |
|---|---|---|
| 6,304,176 B1 * | 10/2001 | Discenzo ................. 340/539.26 |
| 6,330,433 B1 | 12/2001 | Jager |
| 6,456,675 B2 | 9/2002 | Wagner et al. |
| 6,762,686 B1 | 7/2004 | Tabe |
| 6,947,716 B2 | 9/2005 | Ono |
| 6,963,307 B2 | 11/2005 | Mohammadi |
| 7,119,745 B2 | 10/2006 | Gaucher et al. |
| 7,173,574 B2 | 2/2007 | Koide |
| 7,212,838 B2 | 5/2007 | Raghothaman |
| RE40,111 E | 2/2008 | Sanderford et al. |
| 7,386,352 B2 * | 6/2008 | Davis et al. ...................... 700/9 |
| 7,424,403 B2 * | 9/2008 | Robinson et al. ............ 702/189 |
| 7,463,199 B2 | 12/2008 | Soler Castany et al. |
| 7,489,948 B2 | 2/2009 | Taromaru et al. |
| 7,659,812 B2 | 2/2010 | Yegin et al. |
| 7,764,188 B2 * | 7/2010 | O'Neal et al. ................. 340/679 |
| 7,808,400 B2 * | 10/2010 | McCollough ............ 340/870.07 |
| 8,014,744 B1 | 9/2011 | Kopikare et al. |
| 8,106,765 B1 * | 1/2012 | Ackerson et al. ............ 340/538 |
| 8,264,373 B2 * | 9/2012 | Hagg ........................ 340/870.07 |
| 8,346,191 B2 * | 1/2013 | Robinson et al. ......... 455/115.1 |
| 8,571,491 B2 * | 10/2013 | Heitmeier et al. ........... 455/90.1 |
| 8,760,825 B2 * | 6/2014 | Erger et al. ...................... 361/42 |
| 2004/0198228 A1 | 10/2004 | Raghothaman |
| 2009/0066527 A1 | 3/2009 | Teachman |
| 2009/0295648 A1 | 12/2009 | Dorsey et al. |
| 2010/0120415 A1 | 5/2010 | Urquhart et al. |
| 2012/0293015 A1 * | 11/2012 | Johnson et al. .............. 307/117 |

FOREIGN PATENT DOCUMENTS

| | | |
|---|---|---|
| EP | 1 569 361 B1 | 5/2010 |
| JP | 2007237823 A * | 9/2007 |
| WO | WO 99/25077 A1 | 5/1999 |

* cited by examiner

HYBRID POWER MODULE WITH FAULT DETECTION

BACKGROUND

The present invention relates generally to industrial process field devices, and more particularly to a hybrid power module for powering a wireless industrial process field device.

The term "field device" covers a broad range of process management devices that measure and control parameters such as pressure, temperature, and flow rate. Many field devices are transmitters which act as communication relays between a transducer for sensing or actuating an industrial process variable, and a remote control or monitoring device such as a computer in a control room. The output signal of a sensor, for example, is generally insufficient to communicate effectively with a remote control or monitoring device. A transmitter bridges this gap by receiving communication from the sensor, converting this signal to a form more effective for longer distance communication (for example, a modulated 4-20 mA current loop signal, or a wireless protocol signal), and transmitting the converted signal to the remote control or monitoring device.

Field devices are used to monitor and control a variety of parameters of industrial processes, including pressure, temperature, viscosity, and flow rate. Other field devices actuate valves, pumps, and other hardware of industrial processes. Each field device typically comprises a sealed enclosure containing actuators and/or sensors, electronics for receiving and processing sensor and control signals, and electronics for transmitting processed sensor signals so that each field device and industrial process parameter may be monitored remotely. Large scale industrial manufacturing facilities typically employ many field devices distributed across a wide area. These field devices usually communicate with a common control or monitoring device, allowing industrial processes to be centrally monitored and controlled.

Field devices increasingly use wireless transceivers to communicate with centralized control or monitoring systems. Wireless devices extend the reach of control or process monitoring systems beyond that of wired devices to locations where wiring may be difficult and expensive to provide. In some cases wireless field devices may be powered by direct electrical connection to power utilities such as 120V AC utilities, or powered data. More often, however, power utilities are not located nearby or cannot readily be installed in hazardous locations where instrumentation and transducers must operate. Accordingly, field devices are often locally powered by power sources with limited capacity, either stored, as in the case of a long-life battery, or produced, as in the case of a solar panel. Batteries are expected to last more than five years and preferably last as long as the life of the product. Because local power sources have limited capacities, the use of lower power electronics and RF radios is frequently essential for many wireless field devices.

Many field device designs enclose an attached battery under a cover of the sealed enclosure of the field device. Other field devices utilize power from external sources such as solar panels, energy harvesters such as vibrational or thermo-electric scavengers, or a nearby utility grid connection. Each method of powering a wireless field device conventionally requires a different wiring terminal interface. Field devices which run partly or entirely on battery power typically incorporate terminal blocks which provide contact points to an attached battery. Field devices which run on grid power, by contrast, include terminal blocks which provide wired connections for grid power (typically via screw terminals), and which condition grid power for use by the field device. Terminal blocks are often removable, allowing a single field device to be configured for different power sources by swapping in one or another source-specific terminal block. Solar panels, vibrational energy scavenging systems, and other types of local power modules may all use different terminal blocks.

Wireless transmitter field devices broadcast periodic signals corresponding to sensed parameters. Battery-powered transmitters are typically expected operate for five or more years between battery replacements. Depending on the application, existing systems can operate for this period of time while transmitting as often as once every four seconds. Faster update rates are desirable for many industrial applications, but necessitate greater power draw which significantly reduces battery life.

Energy harvesting systems such as solar panels and vibrational or thermoelectric scavengers produce power highly dependent on location and application. Vibrational scavengers can be highly efficient energy sources in areas with high amplitude continuous vibration, for instance, but may not be practical or sufficient in areas with low amplitude or intermittent vibration. Furthermore, while batteries and supercapacitors ordinarily continue to provide power while discharging, energy harvesting systems may experience unpredictable drops in power production, resulting in fluctuating levels of power depending on environmental conditions. Solar panels, for instance, produce no power in the dark, and vibrational scavengers produce no power when attached structures (e.g. motors) are still.

SUMMARY

The present invention is directed toward a wireless field device assembly comprising a process sensor, a housing, a power module, and a processor. The process sensor is configured to monitor a process variable and produce a sensor signal. The housing encloses an interior space of the wireless field device. The power module comprises an energy storage device and a connection to a local power source, and is configured to be housed in the wireless field device. The processor is located within the interior space, and is powered by the power module. The processor produces a fault signal value used to differentiate between energy storage device faults, local power source faults, and no-fault states.

DETAILED DESCRIPTION

The present invention is a power module for an industrial wireless transmitter or actuator. This power module includes both an energy storage device such as a battery or a supercapacitor, and power conditioning circuitry for an external power harvesting energy source. Voltage readings from this power module are used to identify fault modes of the power harvesting energy source and the energy storage device.

Figure 1:
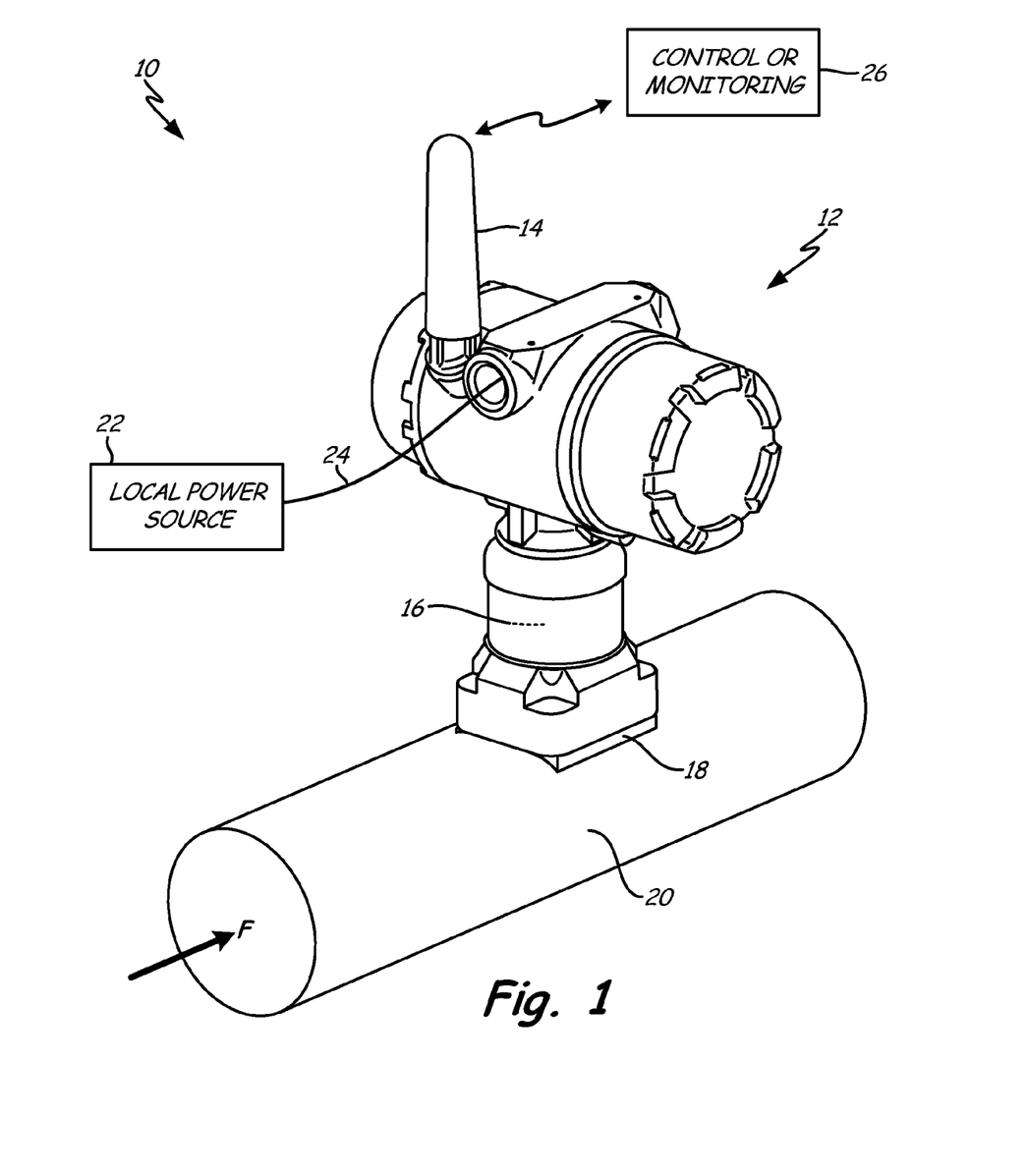
FIG. 1 is a representative diagram of a process monitoring and control system including featuring a wireless field device.

FIG. 1 depicts process measurement or control point 10, comprising wireless field device 12 (with antenna 14), transducer 16, process connection 18, process piping 20, local power source 22, and power connection 24. Wireless field device 12 connects via antenna 14 to control or monitoring system 26.

Process piping 20 carries flow F of process fluid. Wireless field device 12 may be a process transmitter configured to receive, process, and transmit signals from one or more sensors configured to measure parameters of this process fluid. Alternatively, field device 12 may be a wireless controller configured to command a process actuator such as a valve or pump in response to signals from control or monitoring system 26. Transducer 16 is one such sensor or actuator in contact with fluid flow F via process connection 18. Process connection 18 may be a parallel or in-line connection to fluid flow F, depending on the particular industrial application and the parameter measured or actuated by transducer 16. Although only one transducer 16 is shown in FIG. 1, some embodiments of process measurement or control point 10 may include multiple sensors and/or actuators connected to wireless field device 12.

In some embodiments, transducer 16 is a sensor which provides sensor readings to field device 12 for processing and transmission to control or monitoring system 26. In other embodiments, transducer 16 is an actuator which actuates a change on the process fluid in response to signals received from control or monitoring system 26 by field device 12. Although further description hereinafter will focus on the embodiment wherein transducer 16 comprises a sensor, a person skilled in the art will understand that the invention could equally be applied to actuator systems.

Transducer 16 is secured to process piping 20 via process connection 18, and measures one or more parameters of the process fluid, such as flow rate, viscosity, temperature, or pressure. In the depicted embodiment transducer 16 is housed inside field device 12, but alternative embodiments may have transducers located separately from field device 12 and connected to field device 12 by wire. A sensor signal from transducer 16 is sent (e.g. as an analog voltage value or a digital signal) to processing and transmission electronics within field device 12 (see FIGS. 2a and 2b). The particular form of transducer 16 may vary depending on the parameter sensed; in some cases process connection 18 may be configured to such that transducer 16 extends into process flow F, within process piping 20. Field device 12 receives and digitizes (if necessary) process signals from transducer 16, and transmits process messages containing process information to control or monitoring system 26 via antenna 14. Antenna 14 is shown as a single antenna, but may comprise a plurality of diverse antennas in a single array. Field device 12 may transmit signals directly to control or monitoring system 26, or may transmit signals via an intermediate mesh or hub-and-spoke network. In some embodiments, field device 12 may utilize WirelessHART protocol (IEC 62591). Control or monitoring system 26 may be a centralized system which receives sensor data from and/or broadcasts actuator data to a plurality of field devices in wireless field device network 26. Control or monitoring system may be located on-site with wireless field device network 26, or may be located at a remote control room.

Field device 12 includes electronics which process and transmit signals from transducer 16 (or to transducer 16, in the case of an actuator system), as discussed in greater detail below. Both signal processing and signal transmission require energy, which is supplied by a power module as described below with respect to FIGS. 2a and 2b. This power module includes both an internal energy storage device such as a battery or a supercapacitor, and a hookup to local power source 22 over power connection 24. Local power source 22 may, for instance, be a solar cell, an energy harvester such as a vibrational or thermo-electric scavenger, or a utility power grid. Although FIG. 1 depicts local power source 22 as a an external power source situated outside of field device 12, some embodiments of local power source 22 may fit inside field device 12, as described below with respect to FIG. 2b.

Figure 2A:
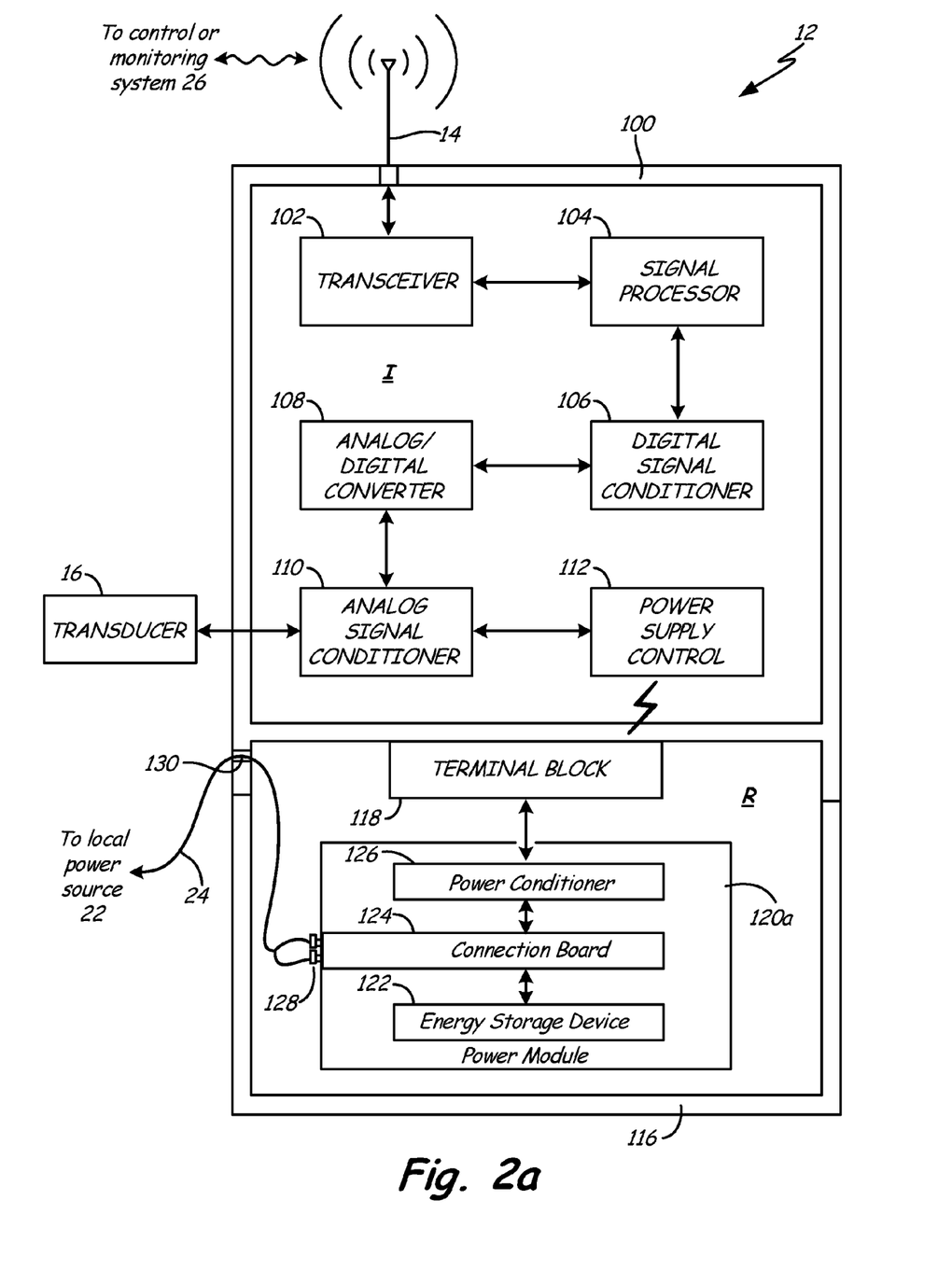
FIG. 2a is a schematic block diagram of the wireless field device of FIG. 1.
Figure 2B:
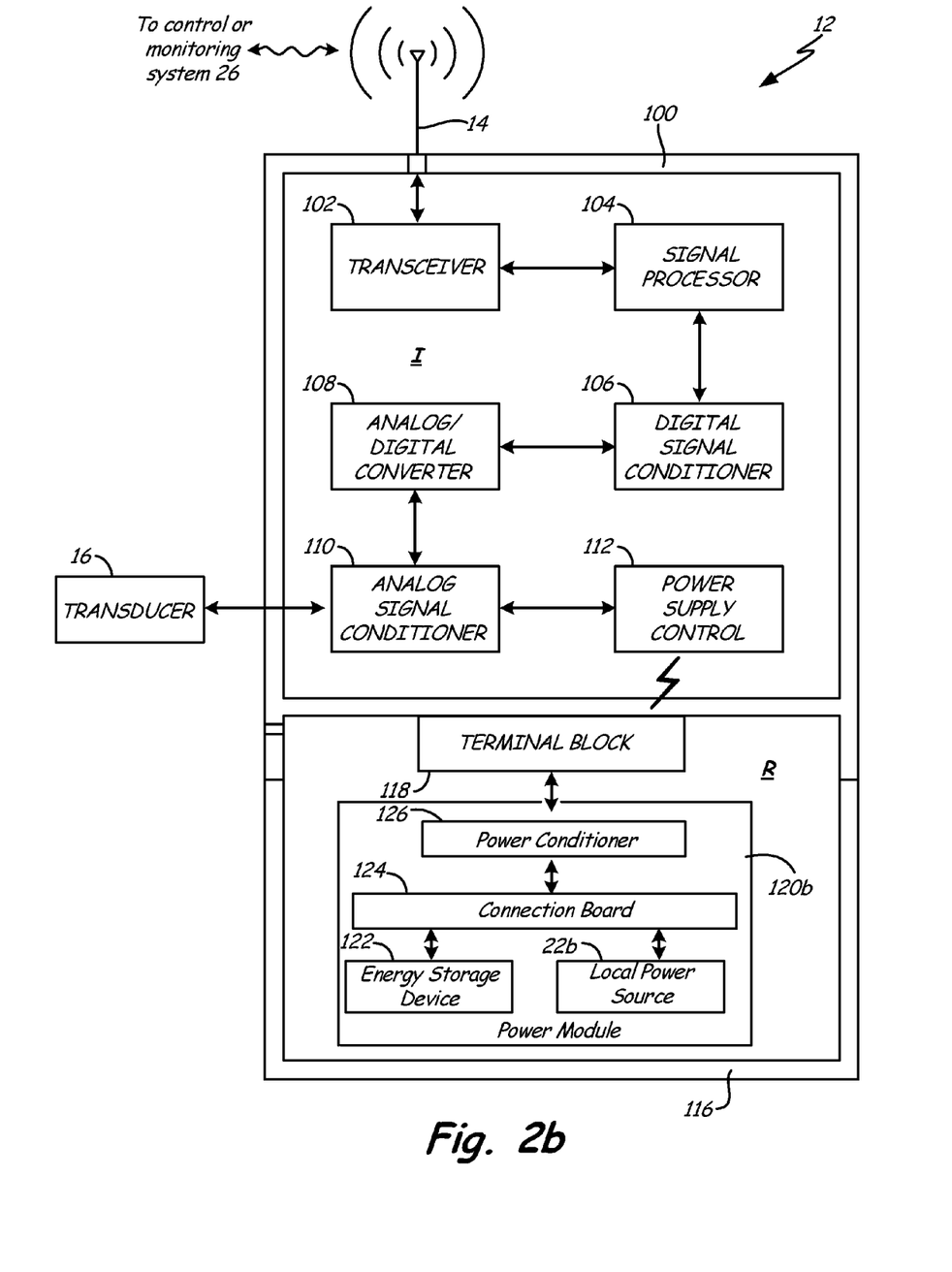
FIG. 2b is a schematic block diagram of an alternative wireless field device according to the present invention.

FIGS. 2a and 2b depict embodiments of field device 12 wherein local power source 22 is external (FIG. 2a) and internal (FIG. 2b) to field device 12. The embodiments of FIGS. 2a and 2b differ only in the composition of power module 120, embodied in FIG. 2a as power module 120a, and in FIG. 2b as power module 120b. The designation "power module 120" is used herein to refer equivalently power module 120a and power module 120b, where the distinction between embodiments is not relevant.

FIGS. 2a and 2b focus on the embodiment of field device 12 which receives and transmits sensor signals to control or monitoring system 26, rather than the embodiment which actuates process machinery based on signals from control or monitoring system 26. As discussed above, power module 120 could be applied to either type of system, as well as field devices which perform both functions.

FIG. 2a is a schematic block diagram of field device 12, illustrating one embodiment of antenna 14, transducer 16, casing or housing 100, transceiver 102, signal processor 104, digital signal conditioner 106, analog/digital converter 108, analog signal conditioner 110, power supply control 112, cover 116, terminal block 118, and power module 120a. Power module 120a comprises energy storage device 122, connection board 124, power conditioner 126, terminal screws 128, and cable conduit 130. FIG. 2b is a schematic block diagram of an alternative embodiment of field device 12, illustrating antenna 14, transducer 16, casing or housing 100, transceiver 102, signal processor 104, digital signal conditioner 106, analog/digital converter 108, analog signal conditioner 110, power supply control 112, cover 116, terminal block 118, and power module 120b. Power module 120b comprises energy storage device 122, connection board 124, power conditioner 126, and local power source 22b.

Field device 12 may be exposed to extreme temperatures and hazardous environments. Field device 12 therefore includes casing or housing 100 to enclose and protect electronics in interior region I. Casing or housing 100 is a rigid, durable body which may be sealed against the environment to protect transceiver 102, signal processor 104, digital signal conditioner 106, analog/digital converter 108, analog signal conditioner 110, and power supply control 112 from degradation or damage. Casing or housing 100 interfaces with cover 116 to enclose receptacle R, which protects and houses removable components such as power module 120. Casing or housing 100 and cover 116 may likewise form an environmental seal, thereby protecting components located in receptacle R from harmful environmental effects. In some embodiments the seal between casing or housing 100 and cover 116 may adequately protect components in interior region I (i.e. transceiver 102, signal processor 104, digital signal conditioner 106, analog/digital converter 108, analog signal conditioner 110, and power supply control 112), such that casing or housing 100 need not fully enclose interior region I, since the combination of casing or housing 100 and cover 116 will shield these components from environmental damage, so long as cover 116 is attached.

According to one embodiment, transceiver 102 is a signal transmitter/receiver which transmits and receives wireless signals via antenna 14. Signal processor 104 is a logic-capable data processor such as a microprocessor. Digital signal conditioner 106 comprises a digital filter which operates on digitized sensor signals, and which may be configurable by signal processor 104 in response to diagnostic programs or instructions from central control or monitoring system 26. Digital signal conditioner 106 may, for instance, operate to filter noise or extract signals of interest from the raw digitized signal provided by analog/digital converter 108. Analog/digital converter 108 is an analog-to-digital converter capable of digitizing analog sensor signals from transducer 16. In some embodiments (such as in actuator systems) analog/digital converter 108 may alternatively or additionally comprise a digital-to-analog converter capable of converting digital signals from signal processor 104 into analog signals for transmission to transducer 16. Analog signal conditioner 110 is a conventional analog signal conditioner, which may for instance perform band-pass filtering to isolate one or more regions of interest from signals received from transducer 16. Power supply control 112 is a conventional power routing device configured to draw power from terminal block 118, and report the voltage received from terminal block 118 to signal processor 104 (for instance via analog signal conditioner 110) as a means for monitoring power quality and imminent power failure. Signal processor 104 uses this voltage information to flag fault modes of local power source 22 and energy storage device 122, as described in further detail below with respect to FIGS. 5 and 6. Power supply control 112 receives electrical power from internal or external sources via terminal block 118, and supplies this power as needed to transceiver 102, signal processor 104, digital signal conditioner 106, analog/digital converter, analog signal conditioner 110, and any other powered components of field device 12.

During operation, analog signal conditioner 110 receives and filters process signals from transducer 16. Transducer 16 may be situated inside field device 12, as depicted in FIG. 1, or may be located externally and connected to analog signal conditioner 110 by wire. Filtered process signals are digitized by analog/digital converter 108, and further filtered by digital signal conditioner 106 prior to processing by signal processor 104. Some embodiments of field device 12 may dispense with one or both of digital signal conditioner 105 and analog signal conditioner 110, particularly if signals from transducer 16 are preconditioned. Similarly, analog/digital converter 108 is unnecessary in embodiments wherein transducer 16 provides a digital signal. Although transceiver 102, signal processor 104, digital signal conditioner 106, analog/digital converter 108, and analog signal conditioner 110 have been described as distinct components, the functions of some or all of these components may in some embodiments be performed by shared hardware such as a common microprocessor. Field device 12 may also include a local operator interface (not shown) with, for instance, a screen and/or input keys allowing an operator to interact directly with field device 12. Like other powered components of field device 12, such a local operator interface would draw power from power supply control 112.

Powered components of field device 12 receive power from power supply control 112. Power supply control 112 in turn draws power from power module 120 through terminal block 118. Terminal block 118 is a power routing component configured to mate with and draw power from power module 120. Depending on the internal electronics of field device 12, terminal block 118 may accept AC or DC power. In some embodiments, terminal block 118 may serve to anchor power module within receptacle R. Terminal block 118 may permanently affixed to field device 12, or may be a modular component which can be swapped out as needed, to provide an interface with alternative power sources.

Power module 120 is a hybrid device which provides power both from energy storage device 122, and from local power source 22. As illustrated in the embodiment shown in FIG. 2a, power module 120b comprises energy storage device 122, connection board 124, power conditioner 126, and terminal screws 128. Energy storage device 122 may be a capacitor, supercapacitor, rechargeable battery, primary (non-rechargeable) battery, or any other conventional compact energy storage device. Power conditioner 126 may include a capacitor, switching circuits, filtering components, and voltage and/or current limiting components. Although FIGS. 2a and 2b depict energy storage device 122 as a single unitary device, some embodiments of power module 120 may include multiple distinct power cells of the same or different types. Connection board 124 is an internal circuit board which provides a power connection between energy storage device 122, terminal screws 128, and power conditioner 126. In many embodiments of field device 12, particularly those which are expected to operate in extreme environments and at extreme temperatures, rechargeable batteries may not be practical. In appropriate environments, however, rechargeable embodiments of energy storage device 122 may be recharged with power from local power source 22. Energy storage device 122 may be removable from power module 120.

According to this embodiment, power module 120a includes terminal screws 128. Terminal screws 128 serve as a terminal interface for power connection 24 by attaching exposed loops or other exposed conductive sections of power connection 24 to power module 120a. Terminal connection 24 preferably enters receptacle R via cable conduit 130. Cable conduit 130 may be any sort of opening which allows power connection 24 to pass through casing or housing 100 or cover 116, into receptacle R. For greater protection of terminal block 118, power module 120, and any other components located within receptacle R, cable conduit 130 may include a cable gland which forms a seal about terminal connection 24 to shield receptacle R from environmental hazards.

Power conditioner 126 is a compact device which performs conventional power conditioning specific to local power source 22. Power conditioner 126 may, for instance, limit voltage and/or current so as to protect components of field device 12. Power conditioner 126 may also incorporate an AC/DC converter, where appropriate, if power source 22 is an AC power source. Power conditioner 126 may be fabricated as a part of connection board 124, or may be a separate component attached to connection board 124.

Power module 120 provides energy to terminal block 118 from two sources: energy storage device 122, and local power source 22. As discussed in the Background of the present invention, external power sources such as energy scavenging systems and solar panels are often limited in the power they can supply. Some embodiments of local power source 22 can provide limited but substantially constant power insufficient to power signal processor 104, analog and digital signal conditioners 110 and 106, analog/digital converter 108, and particularly transceiver 102 at all times. Other embodiments of local power source 22 may provide greater but unreliable power. In either case, power module 120 supplements the power from local power source 22 with stored power from energy storage device 122 to meet the power requirements of powered components of field device 12. Depending on the environment and application of field device 12, more or less of the total power consumed by field device 12 may come from energy storage device 122 or local power source 22. Where power from local power source 22 is relatively scant or unreliable, field device 12 will be powered primarily from energy storage device 122, and supplemental power from local power source 22 will extend the lifetime of energy storage device 122. Where power from local power source 22 is relatively plentiful and reliable, field device 12 can be powered primarily from local power source 22, and supplemental power from energy storage device 122 will fill in for any downtimes or sags in power from local power source 22.

As noted above with respect to FIG. 1, local power source 22 may take a variety of forms. By way of example, a vibrational scavenger acting as local power source 22 may satisfy substantially all power requirements of field device 12 while the motor is active (e.g. half the time, with a 50% duty cycle). When the motor is inactive, power module 120 will instead provide power from energy storage device 122. In another embodiment, a thermoelectric energy scavenger acting as local power source 22 might provide constant but weak power sufficient to power signal processor 104, digital and analog signal conditioners 105 and 110, and analog/digital converter 108, but insufficient to power transceiver 102 during signal transmissions. In such a case, energy storage device 122 could provide supplemental power during transmissions. If local power source 22 could only provide even weaker power, energy storage device 122 might be required to power all components at all times. In such a case, the inclusion of local power source 22 could extend the expected lifetime of energy storage device 122, increasing time between replacement. In a third embodiment, a direct grid connection might constitute local power source 22. In such a case, external power source will completely power all components of field device 12 during ordinary conditions. Should the grid experience an outage, or the grid connection fail, energy storage device 122 will act as a backup power source, allowing field device 12 to continue to operate uninterrupted.

FIG. 2b depicts an embodiment of field device 12 equipped with power module 120b. Unlike power module 120a, power module 120b does not include terminal screws 128 or any other means for connecting to an external power source. Instead, power module 120b includes local power source 22b, a variant of local power source 22 (see FIG. 1) sized to fit within receptacle R. Local power source may be, for instance, a vibrational scavenger which harvests energy from vibration of field device 12. This embodiment is particularly appropriate to applications wherein field device 12 is likely to be mounted near pumps, motors, or other reliable sources of vibration. Local power source 22b may be permanently mounted within power module 120b, or may be detachably connected to power module 120b via a conductive interface which serves as a functional equivalent of terminal screws 128 (see FIG. 2a). Energy storage device 122, connection board 124, and power conditioner 126 are substantially functionally identical in power module 120a and 120b, but may take slightly different forms (e.g. different dimensions or shapes) as needed in power module 120b to accommodate local power source 22.

Both embodiments of power module 120 provide hybrid power from energy storage device 122 and local power source 22 (including 22b). To the extent that power from local power source 22 is available, local power source 22 is used preferentially. When power from local power source 22 is unavailable or insufficient, power from energy storage device 122 is used instead or in addition. Power supply control 112 monitors voltage from power module 120 (via terminal block 118), and thereby detects faults in local power source 22 and energy storage device 122.

Although terminal block 118 and power module 120 are depicted as separate components in FIG. 2, some embodiments may combine the functions of terminal block 118 and power module 120 into a single removable component which attaches to field device 12 within receptacle R, and which is selected to match both the particular model of field device 12, and a particular type of local power source 22.

Figure 3:
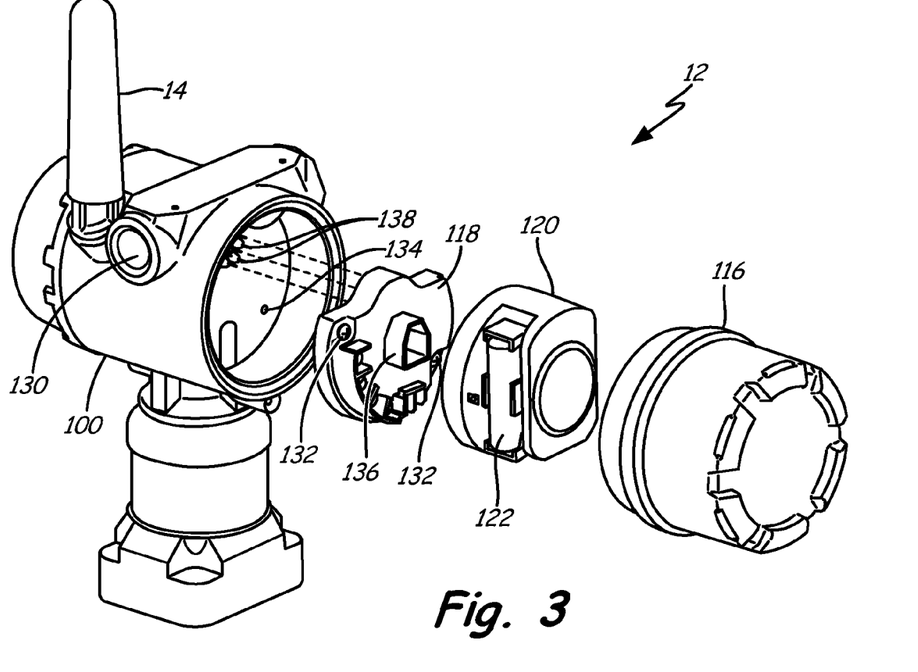
FIG. 3 is an exploded perspective view of the wireless field device of FIG. 1.

FIG. 3 is an exploded perspective view of field device 12, comprising antenna 14, casing or housing 100, cover 116, terminal block 118, power module 120, energy storage device 122, cable conduit 130, terminal block attachment screws 132, terminal block attachment screw holes 134, power source attachment 136, and power supply connector 138.

As discussed above with respect to FIG. 2, power supply control 112 provides power to all powered components of field device 12. Power supply control 112 receives electrical power from terminal block 118 via power supply connector 138, an electrical contact which interfaces with terminal block 118 when terminal block 118 is secured in place. Power supply connector 138 may, for instance, comprise a plurality of conductive pins which interface with corresponding recesses or jacks in terminal block 118. As depicted in FIG. 3, terminal block 118 is secured in contact with power supply connector 138 by terminal block attachment screws 132. Terminal block attachment screws 132 are threaded screws which fasten into terminal block attachment holes 134 on casing or housing 100, thereby removably anchoring terminal block 118. Although terminal block 118 is depicted as secured by terminal block attachment screws 132, alternative embodiments may use other means to secure terminal block 118, such as by bayonets or screws, or by a snap or friction fit. In alternative embodiments, terminal block 118 may be a non-removable component permanently affixed to, or mounted in, a wall of casing or housing 100 shared by receptacle R and internal space I. Terminal block 118 is equipped to receive AC or DC via one or more terminals. These terminals may take the form of flat conductive contacts which abut power module 120.

Pursuant to this embodiment, power module 120 is secured to terminal block 118 by means of power source attachment 136. Power source attachment 136 is depicted as an electrical contact surrounded by a protruding sleeve on terminal block 118 which forms a snap or friction fit and an electrical contact with internal power module 120. In other embodiments, power source attachment 136 might comprise a hook, screw, latch, or any other conventional means for securing internal power module 120 to terminal block 118, together with any conventional electrical connection. Power source attachment 136 supports internal power module 120 in the absence of cover 116 (e.g. when cover 116 is removed to install or remove components within receptacle R). Cover 116 may, however, help to retain internal power module 120 against terminal block 118, as discussed below with respect to FIGS. 4a and 4b. Terminal block 118 may, where appropriate, provide power conditioning to regulate the voltage or current, and to invert or rectify power received from power module 120. Power module 120 provides power from local power source 22 and/or energy storage device 122. Power from power module 120 may originate exclusively from local power source 22 or energy storage device 122, or may come from a combination of both sources. In some embodiments, local power source 22 may be a rechargeable power source such as a capacitor or rechargeable battery, and may be charged from local power source 22.

As discussed above with respect to FIG. 2, energy storage device 122 may be a conventional battery or supercapacitor. Energy storage device 122 is depicted as removably coupled to power module 120 via a snap fit or other conventional locking mechanism. In other embodiments, power source 122 may be fully enclosed within power module 120, and may or may not be removable.

Power module 120 provides a contact point for power connection 24 from which it receives power from local power source 22. This contact point may comprise terminal screws 128 (see FIGS. 2a and 4a), or any equivalent attachment means for an electrical contact or connection. Connection board 124 is a circuit board with conductive contacts at the locations of terminal screws 128. Terminal screws 128 are conductive fasteners used to attach one or more wires of power connection 24 to connection board 124. Where power connection 24 includes hooks or loops, terminal screws 128 and connection board 124 will interface with these hooks or loops to anchor power connection 24 to power module 122. Depending on the form of power connection 24 (which may in turn depend on power source 24), terminal screws 128 may be replaced with plug, clips, or other attachment means. Although FIG. 3 depicts terminal screws 128 for connecting power module 120 to an external embodiment of local power source 22, power module 120 may instead include an internal local power source 22b (see FIG. 2b). Such a local power source 22b could be located within power module 120, or attached to the exterior of power module 120 in such a manner as to fit under cover 116.

As described above with respect to the embodiment shown in FIG. 2, cover 116 meets casing or housing 100 in a seal, thereby protecting components within receptacle R (e.g. terminal block 118 and power module 120). Power module 120 fits snugly inside receptacle R, under cover 116 and in contact with terminal block 118. Local power source 22 is connected to power module 120 via power connection 24 (see FIG. 2), which extends through cable conduit 130 into receptacle R, and affixes to terminal screws 128 (or analogous fasteners). As described above, power module 120 includes power conditioner 126, which conditions power from local power source 22 and energy storage device 122 for use by powered components of field device 12. The voltage of power provided by power module 120 varies as a function of the condition of local power source 22 and energy storage device 122, as described below with respect to FIGS. 5 and 6, below. This variation in voltage is used to detect and flag faults in both power sources.

Figure 4A:
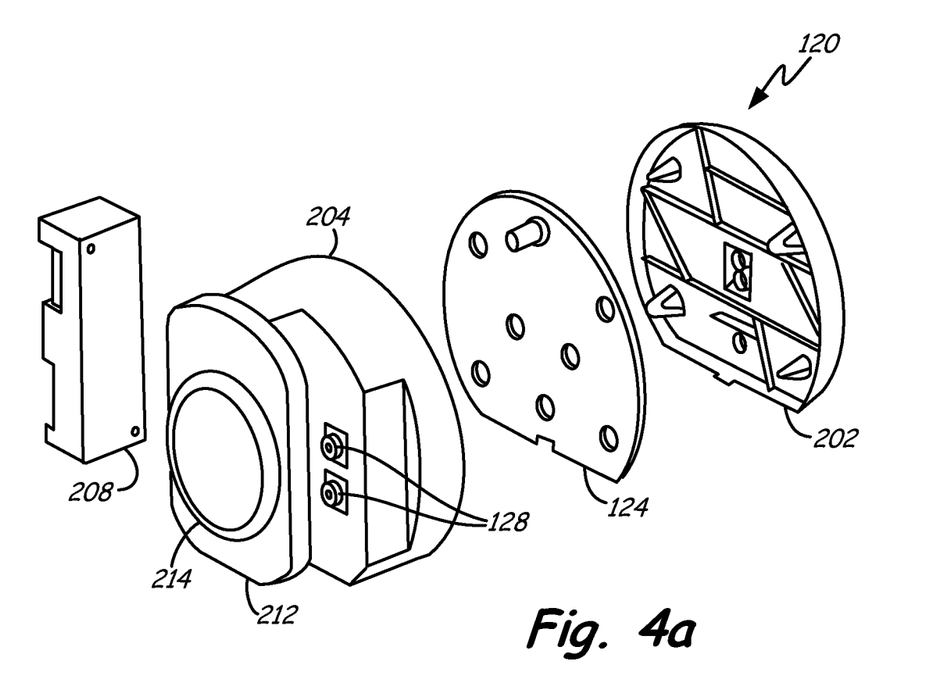
FIGS. 4a and 4b are exploded perspective views of a power module of the wireless field device of FIG. 1, from two angles.
Figure 4B:
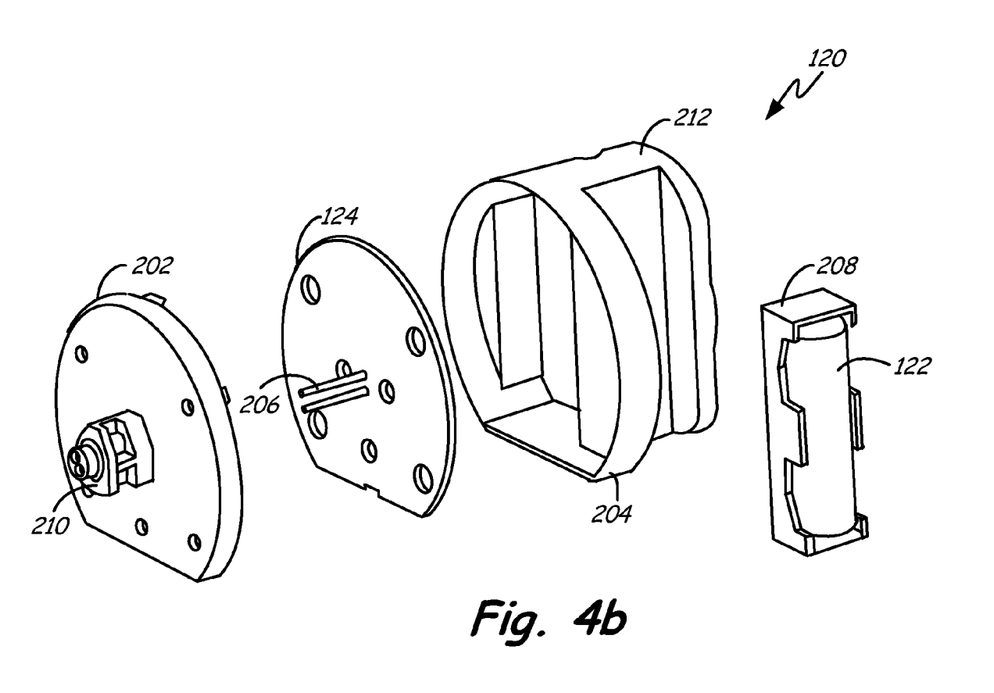

FIGS. 4a and 4b are exploded perspective views of one embodiment of power module 120 from two different angles. Power module 120 includes energy storage device 122, connection board 124, terminal screws 128, casing front 202, casing back 204, terminal posts 206, energy storage device attachment 208, friction fit connection 210, support 212, and anchoring ring 214.

In this embodiment, power module casing 200 is a rigid protective enclosure which surrounds and protects connection board 124, and which supports terminal screws 128 and energy storage device 122 snugly within receptacle R of field device 12. As noted above, connection board 124 is a circuit board which provides electrical connections to energy storage device 122 and terminal screws 128, and which may house or mount power conditioner 126 (see FIGS. 2a and 2b). Terminal posts 206 are conductive posts which extend from connection board 124 through friction fit connection 210 of casing front 202 to form an electrical connection with power source attachment 136 of terminal block 118 (see FIG. 3). Friction fit connection 210 is a connecting portion of casing front 202 which extends into and mechanically attaches to power source attachment 136, thereby securing power module 120 to terminal block 118. Friction fit connection 210 may comprise one or more snap rings or similar components to form a snug connection to power source attachment 136.

According to this embodiment, energy storage device attachment 208 is a conventional snap-in battery housing, or an equivalent means for securing energy storage device 122. Energy storage device attachment 208 is anchored to casing back 204, and provides both mechanical retention and an electrical connection for energy storage device 122. As discussed above, energy storage device 122 may be a specialized energy cell, an off-the-shelf battery, a supercapacitor, or any similar energy storage device. The size and shape of energy storage device attachment 208 may vary depending on the type of energy storage device 122 selected. Energy storage device attachment 208 provides electrical contacts between energy storage device 122 and connection board 124.

Casing back 204 includes support 212, a substantially rigid portion extending away from connection board 124 to meet with cover 116 (see FIG. 3), so as to provide a snug fit within receptacle R. This fit helps to hold friction fit connection 210 in place at power source attachment 136. In the depicted embodiment, support 212 includes anchoring ring 214, a raised circular ridge on the outermost surface of casing back 204. Anchoring ring 214 is sized to interface with a complementary ring or wave spring on the interior (not shown) of cover 116, thereby securing power module 120 against vibration, between terminal block 118 and cover 116. Terminal screws 128 extend through back casing 204 into connection board 124, thereby providing an electrical interface for power connection 24 to local power source 22. For embodiments of field device 12 wherein local power source 22 is enclosed within receptacle R (see local power source 22b, described above with respect to FIG. 2b), terminal screws 128 may be omitted in favor of a direct connection between connection board 124 and local power source 22 (if local power source 22 is included within power module 120), or a detachable hookup for local power source 22 conceptually similar to energy storage device attachment 208 (if local power source 22 is detachably affixed to power module 120). Alternatively, terminal screws 128 or similar attachment means may be used to connect connection board 124 to an entirely separate local power source 22 housed between casing back 204 and cover 116. In this last embodiment, support 212 could be reduced to provide space for local power source 22.

Whether local power source 22 is housed within receptacle R or not, power module 120 provides an electrical connection which draws power preferentially from power source 22, and supplementally from energy storage device 122 when power from local power source 22 is unavailable or insufficient to satisfy the power needs of wireless device 12. Although particular applications or installation locations may result in either of power source 22 or energy storage device 122 providing the bulk of the power required by field device 12, field device 12 preferably draws power from local power source 22, when available, before depleting energy storage device 122. Power from each source is conditioned as needed by power conditioner 126, inverting or rectifying power from local power source 22 and energy storage device 122, as needed. In this way, power module 122 is able to provide continuous power for field device 12 despite varying availability of power from external power source 22, while extending the lifetime of energy storage device 122.

Figure 5:
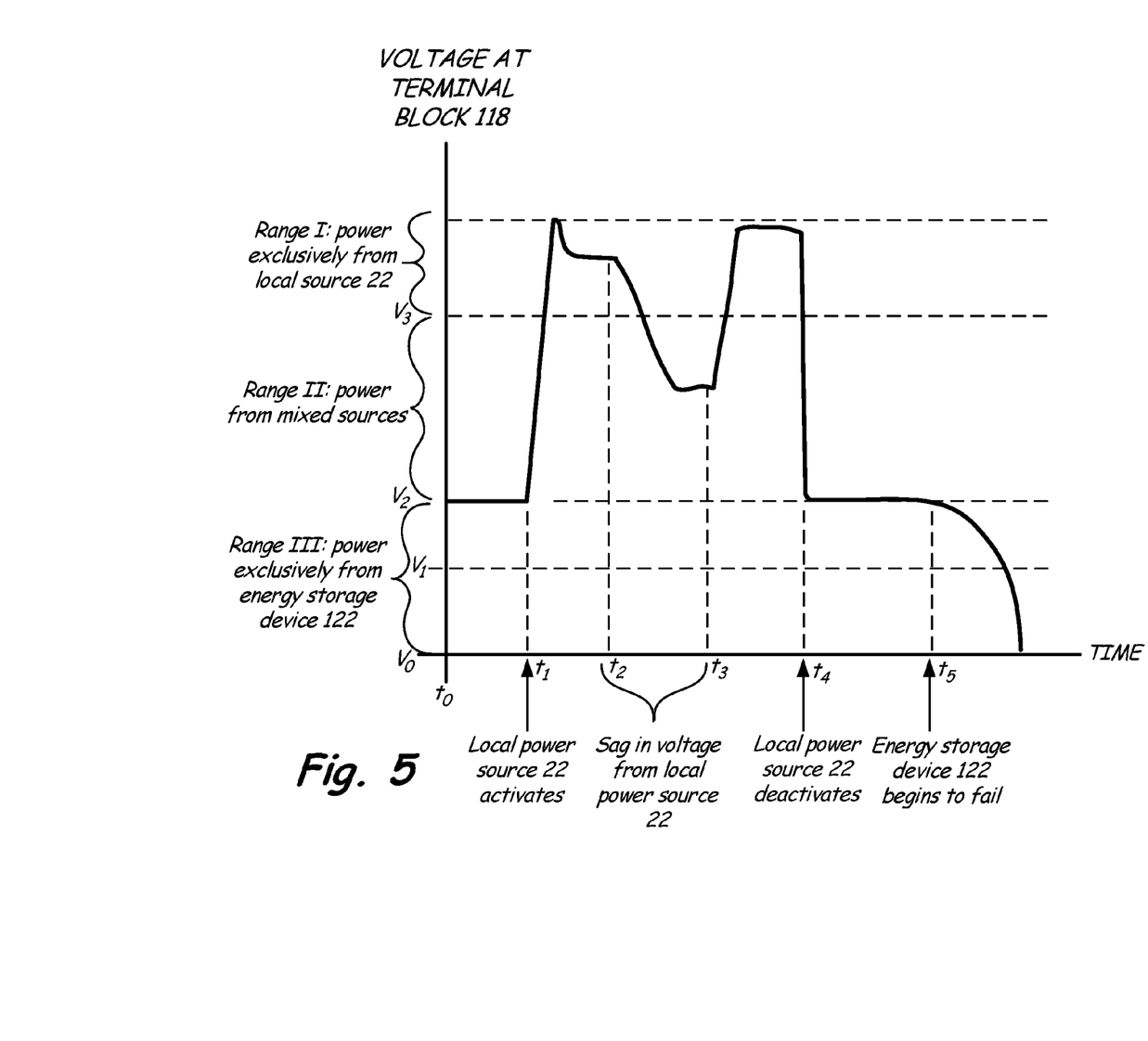
FIG. 5 is an illustrative graph of voltage received by the wireless field device of FIG. 1 as a function of time.

FIG. 5 is a graph of voltage received from power module 120 as a function of time. FIG. 5 is intended to serve only as an illustrative example of possible voltage fluctuation during operation of field device 12, and thereby to illustrate the operation of fault detection system discussed in further detail below with respect to FIG. 6. FIG. 5 is not to scale, and the particular details of the shape of the voltage curve of FIG. 5 are of no intrinsic significance to the functioning of power module 120 of field device 12.

As discussed above with respect to FIGS. 2a, 2b, 3, 4a, and 4b, power from power module 120 may be provided by local power source 22, energy storage device 122, or a combination of the two. Generally speaking, field device 12 may operate in three power modes: a first mode wherein all electric power is supplied by local power source 22, a second mode wherein field device 12 operates on a combination of power produced by local power source 22 and stored energy from energy storage device 122, and a third mode wherein field device 12 operates exclusively on stored energy from energy storage device 122. The voltage output of power module 120 is generally highest in the first mode (within constraints imposed by power conditioner 126), lowest in the third mode, and intermediate in the second mode. More particularly, voltage in the third mode typically matches a battery voltage of energy storage device 122, while voltage in the first and second modes exceeds this battery or capacitor voltage by an amount dependent on the degree of voltage sag of power from local power source 22.

Over time, however, voltage from local power source 22 may fluctuate depending on power draw and the condition of local power source 22. A sag in voltage from local power source 22 may indicate that local power source 22 has fallen offline (e.g. if local power source 22 constitutes a solar panel in a dark area), or may indicate that local power source 22 is incapable of satisfying the instantaneous power demands of field device 12 alone, necessitating supplemental power from energy storage device 122. In addition, minor voltage fluctuations can occur even while field device 12 is powered entirely by local power source 22.

FIG. 5 depicts voltage in ranges corresponding to all three modes, as indicated along the y-axis (voltage) of the graph. These modes correspond to time domains wherein local power source 22 and energy storage device 122 are capable of supplying changing amounts of power.

At time $t_0$, field device 12 is powered exclusively from energy storage device 122, which maintains a substantially steady (but likely slightly diminishing) voltage≈$V_2$. At time $t_1$, local power source 22 activates, and entirely takes over the powering of field device 12, providing a voltage in excess of voltage $V_3$. Voltage $V_3$ corresponds to a threshold below which energy storage device 122 contributes to powering field device 12.

Between times $t_2$ and $t_3$, voltage from local power source 22 sags from above to below $V_3$. A voltage sag of this kind could be due to increased power draw from local power source 22, or to a drop-off in power produced by local power source 22 (e.g. a decrease in the light incident on a solar panel, or a reduction in the amplitude of vibration at a vibrational harvester).

At time $t_4$, local power source 22 deactivates. Some embodiments of local power source 22 may frequently activate and deactivate over the course of operation of an industrial process. A vibrational scavenger affixed to a 50% duty cycle motor, for instance, will deactivate (i.e. produce no power) and reactivate regularly, as the motor turns off and on. Other embodiments of local power source 22 might ordinarily be expected to provide constant power, with any deactivation indicating a fault condition.

FIG. 5 shows energy storage device 122 beginning to fail at time $t_5$, causing voltage received at terminal block 118 to drop further. Voltage fall-off below voltage $V_2$ may, for instance, correspond to the depletion of a battery or the discharge of a supercapacitor, depending on the particular embodiment of energy storage device 122. Although FIG. 5 shows voltage rapidly falling off beginning at time, battery or supercapacitor failure need not be abrupt. In ordinary circumstances, gradual depletion of energy storage device 122 will result in a gradual drop in voltage received at terminal block 118 while field device 12 is powered exclusively by energy storage device 122. As energy storage device 122 discharges, voltage at terminal block 118 eventually falls below voltage $V_1$, a threshold indicating depletion of energy storage device 122.

Figure 6:
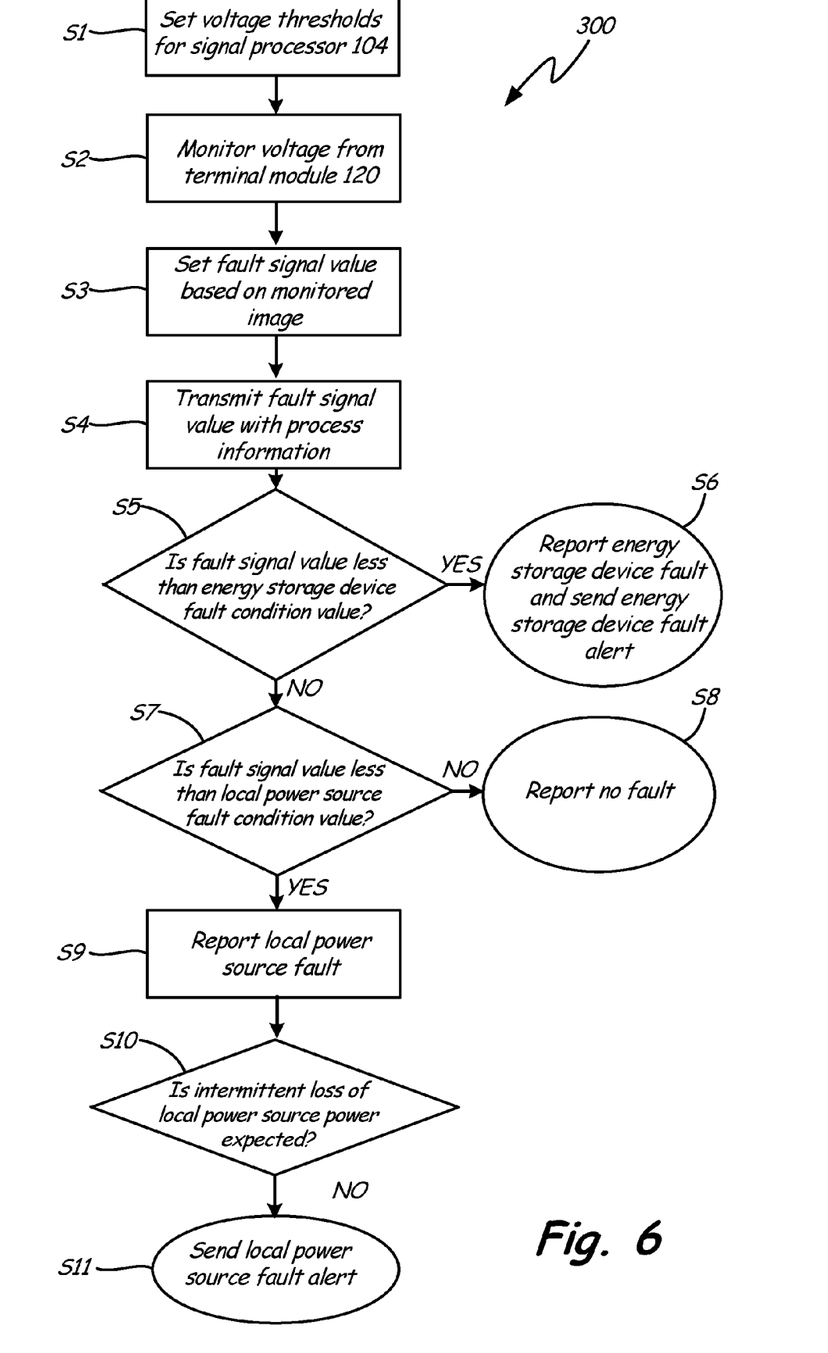
FIG. 6 is a flowchart of a fault detection method for the wireless field device of FIG. 1.

FIG. 6 is a flowchart of a method 300 for detecting power supply faults based on voltage received from power module 120. More particularly, method 300 allows control or monitoring system 26 (see FIG. 1) to differentiate between faults in local power source 22 and faults in energy storage device 122 based on a fault signal value set by signal processor 104. Method 300 allows control or monitoring system 26 to distinguish between modes 1, 2, and 3 of FIG. 5, and provide alerts to users and maintenance personnel, accordingly.

As discussed above with respect to FIGS. 2a and 2b, power supply control 112 reports voltage from signal processor 104, indicating the voltage of power received from terminal block 118 (and thereby from power module 120). In some cases this voltage report may be received by way of analog signal conditioner 110, analog/digital converter 108, and/or digital signal conditioner 106. Signal processor 104 is set with a series of voltage thresholds corresponding to different possible voltage values which could be provided by power module 120 during ordinary and faulty operation. (Step S1). These voltage thresholds may be programmed or hardwired into signal processor 104 during manufacture, or may be set in response to signals received from control or monitoring system 26 or another user terminal via transceiver 102. Signal processor 104 monitors voltage received from power module 120 using power supply control 112. (Step S2). As discussed above with respect to FIG. 1, signal processor 104 regularly transmits process signals to control or monitoring system 26. These process messages include process variable signals which reflect sensor readings from transducer 16. In addition, each process message includes a fault signal value from which failure states of energy storage device 122 and local power source 22 can be flagged and identified. Although the following discussion focuses on an embodiment wherein each process message includes both a process variable signal and a fault signal value, alternative embodiments may separate these two components, e.g. by transmitting a fault signal value only occasionally, or by transmitting fault information separately. In some embodiments, different signal processors may be used for proves variable signals and energy fault signal values.

Based on comparison of the monitored voltage with the voltage thresholds, signal processor 104 sets a fault signal value in each process message reflecting the present voltage provided by power module 120. (Step S3). For the purposes of the present explanation, high voltages will be presumed to correspond to high fault signal value values, and low voltages to low fault signal value values, although this need not be the case in all embodiments. Field device 12 transmits the process message containing this fault signal value wireless by means of transceiver 102. (Step S4).

Control or monitoring system 26 regularly receives process messages from individual field devices (including field device 12) within wireless field device network 26. Upon receiving a process message with a fault signal value from field device 12, control or monitoring system 26 ascertains whether the value of this fault signal value is less than an energy storage device fault condition threshold. (Step S5). This fault condition threshold is a preset number corresponding at least approximately to voltage $V_1$ of FIG. 5, a voltage less than voltage $V_2$ ordinarily provided by energy storage device 122. FIG. 5 is not drawn to scale; in some embodiments voltage $V_1$ may be only slightly lower than voltage $V_2$. If the fault signal value received by monitoring or control system 26 is less than this energy storage device fault condition threshold, monitoring or control system 26 reports an energy storage device fault (e.g. battery depletion), and sends a corresponding alert notifying users or maintenance personnel so that energy storage device 122 can be replaced or repaired. The energy storage device fault condition threshold may be set to an appropriate value depending on the particular environment and application, to notify users and maintenance personnel of imminent energy storage device failure sufficiently in advance of complete failure.

If the fault signal value is greater than the energy storage device fault condition threshold, monitoring or control system 26 ascertains whether the fault signal value is nevertheless less than a local power source fault condition threshold approximately corresponding to a voltage value between $V_2$ and $V_3$ (see FIG. 5). (Step S7). If not, monitoring or control system 26 reports no fault. (Step S8). If so, monitoring or control system 26 reports a local power source fault. (Step S9). A fault signal value lower than the local power source fault condition threshold, but greater than the energy storage device fault condition threshold, indicates that local power source 22 is incapable of supplying all power utilized by field device 12. Depending on the application and environment of field device 12, the local power source fault condition threshold may be selected to correspond with voltage $V_3$ (such that a fault is reported whenever local power source 22 is unable to completely power field device 12), with voltage $V_2$ (such that a fault is reported only when local power source is unable to supply any power to field device 12), or with any intermediate voltage.

Fault conditions may be archived for maintenance purposes; not all reported fault conditions need be accompanied by a fault alert. In particular, some embodiments of process measurement or control point 10 may sometimes lose local power source 22 during ordinary operation, as noted above. Upon reporting a local power source fault, control or monitoring system 26 determines whether occasional loss of local power source 22 is expected for field device 12. (Step S 10). This determination may be based on a history of voltage received by field device 12, on configuration information provided by a user, or on any other appropriate factors. If occasional or periodic losses of local power source 22 are expected, control or monitoring system 26 may not transmit any alert indicating a fault at local power source 22. If occasional or periodic losses of local power source 22 are not expected, however, control or monitoring system 26 will preferably transmit a local power source fault alert notifying users and maintenance personnel so that local power source 22 can be replaced or repaired. In some cases, reporting a local power source fault may trigger a timer or increment a counter, such that a sufficient number of fault reports or a sufficient time spent at low voltage will trigger a local power source fault alert, even for systems wherein intermittent losses of local power source 22 are expected.

The preceding description has focused on monitoring or control system 26 as the source of fault reports and alerts. In alternative embodiments, however, signal processor 104 of field device 12 may be capable of performing method steps S5-S11 of method 300, and may transmit only a fault alert or fault report to monitoring or control system 26. Regardless of whether field device 12 or control or monitoring system 26 produces these fault reports and fault alerts, method 100 allows power faults in power from power module 120 to be detected and identified using voltage received at power supply control 112. Power module 120 provides increased energy storage device longevity over conventional systems with only batteries or supercapacitors, and provides greater reliability than systems utilizing only local energy sources such as energy harvesting systems. All of these functions are accomplished with a power module configured to fit into receptacle R, with no need for additional external components, or protection for such components to survive harsh environments.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A wireless field device assembly comprising:
   a process sensor configured to monitor a process variable and produce a sensor signal;
   a housing enclosing an interior space of the wireless field device;
   a power module comprising an energy storage device and a connection to a local power source, and configured to be housed in the wireless field device and power the wireless field device via at least one of the energy storage device and the local power source;
   a processor powered by the power module, located within the interior space, and configured to produce a fault signal value that distinguishes between energy storage device faults, local power source faults, and no-fault states.

2. The wireless field device assembly of claim 1, further comprising a cover defining a receptacle between the housing and the cover, and wherein the power module is configured to be housed in the receptacle.

3. The wireless field device assembly of claim 2, wherein the power module is configured to be removably housed in the receptacle.

4. The wireless field device assembly of claim 1, wherein the processor is configured to produce a control/monitoring signal reflecting the sensor signal and the fault signal.

5. The wireless device assembly of claim 1, wherein the fault signal value indicates voltage at the power module, a first range of values of the fault signal value indicates an energy storage device fault, a second range of values of the fault signal value indicates a local power source fault, and a third range of values of the fault signal value indicates a no-fault state.

6. The wireless field device assembly of claim 1, wherein the power module is configured to provide power preferentially from the local power source connection, and supplementally from the energy storage device when power from the local power source is unavailable or insufficient to satisfy power demand.

7. The wireless field device assembly of claim 1, wherein the energy storage device is a battery or a supercapacitor.

8. The wireless field device assembly of claim 1, wherein the energy storage device is removably attached to the power module.

9. The wireless field device assembly of claim 1, wherein the connection to a local power source is configured to receive energy from an energy harvesting device.

10. The wireless field device assembly of claim 9, wherein the receptacle is configured to fit the energy harvesting device.

11. The wireless field device assembly of claim 1, wherein the connection to a local power source includes a wired connection through a conduit in the housing or the cover to an external device located outside of the interior space and the receptacle.

12. The wireless field device assembly of claim 1, wherein the power module includes a power conditioner which conditions power from at least one of the energy storage device and the local power source.

13. The wireless field device assembly of claim 12, wherein the power conditioner is configured to rectify or invert power from at least one of the energy storage device and the local power source.

14. A method for providing and monitoring power for a wireless field device, the method comprising:
connecting a power module so as to provide power to the wireless field device, the power module comprising an energy storage device and a local power source connection;
powering the wireless field device primarily using power from the local power source connection;
powering the wireless field device supplementally using power from the energy storage device, when power from the local power source is unavailable or insufficient to power the wireless field device;
setting a fault signal value of a process signal based on voltage supplied by the power module;
reporting a fault with the local power source if the fault signal value falls within a first range; and
reporting a fault with the energy storage device if the fault signal value falls within a second range.

15. The method of claim 14, wherein the power module is a removable module configured to fit within an enclosed receptacle of the wireless field device.

16. The method of claim 14, further comprising transmitting the fault signal value to a control or monitoring system, and wherein faults with the local power source and the energy storage device are reported by the control or monitoring system.

17. The method of claim 14, further comprising transmitting an energy storage device failure alert if the fault signal value falls within the second range.

18. The method of claim 14, further comprising transmitting a local power source failure alert if the signal value falls within the first range.

19. The method of claim 18, further comprising ascertaining whether intermittent loss of the local power source is expected, and sending a local power source failure alert if the fault signal value falls within the first range and intermittent loss of the local power source is not expected.

20. The method of claim 1, wherein the power module further comprises a power conditioner.

21. The method of claim 20, wherein the power conditioner is configured to rectify or invert power from at least one of the energy storage device and the local power source connection.

22. The method of claim 14, wherein setting the fault signal value comprises setting the fault signal value to a value determined by comparing voltage at the power module with a series of thresholds, such that higher fault signal value corresponds to higher voltage.

23. A wireless field device assembly comprising:
a process sensor configured to monitor a process variable;
a housing enclosing an interior space;
a cover defining a receptacle between the housing and the cover;
a power module configured to fit removably inside the receptacle and power at least a subset of the wireless device assembly;
an energy storage device inside or affixed to the power module, and located within the receptacle;
a local power source electrically connected to the power module;
a processor located within the interior space and configured to produce:
a process variable signal reflecting the process variable monitored by the industrial process sensor; and
a fault signal value that distinguishes between energy storage device faults, local power source faults, and no-fault states based on voltage at the power module.

24. The wireless field device assembly of claim 23, wherein the energy storage device is a battery.

25. The wireless field device assembly of claim 23, wherein the energy storage device is a supercapacitor.

26. The wireless field device assembly of claim 23, wherein the local power source is a utility grid connection.

27. The wireless field device assembly of claim 23, wherein the local power source is an energy harvesting device.

28. The wireless field device assembly of claim 27, wherein the energy harvesting device is configured to fit inside the receptacle with the power module.

29. The wireless field device assembly of claim 27, wherein the energy harvesting devices is a thermoelectric scavenger.

30. The wireless field device assembly of claim 27, wherein the energy harvesting devices is a vibrational scavenger.

31. The wireless field device assembly of claim 27, wherein the energy harvesting devices is a solar panel.

32. The wireless field device assembly of claim 23, wherein the local power source is electrically connected to the power module via a wired connection passing through a conduit in the housing or the cover.

33. The wireless field device assembly of claim 23, wherein the fault signal value indicates voltage at the power module, a first range of values of the fault signal value indicates an energy storage device fault, a second range of values of the fault signal value indicates a local power source fault, and a third range of values of the fault signal value indicates a no-fault state.

* * * * *